US008991273B2

(12) United States Patent
Phillips et al.

(10) Patent No.: US 8,991,273 B2
(45) Date of Patent: Mar. 31, 2015

(54) APPARATUS AND METHOD FOR INSPECTING HIGH VOLTAGE INSULATORS

(75) Inventors: Andrew John Phillips, Harrisburg, NC (US); Jason Cary Nave, San Antonio, TX (US); Glynn Ray Bartlett, Boerne, TX (US); Cody Michael Porter, San Antonio, TX (US); Ian Royappan Meinzen, San Antonio, TX (US)

(73) Assignee: Electric Power Research Institute, Inc., Charlotte, NC (US)

( * ) Notice: Subject to any disclaimer, the term of this patent is extended or adjusted under 35 U.S.C. 154(b) by 289 days.

(21) Appl. No.: 13/587,536

(22) Filed: Aug. 16, 2012

(65) Prior Publication Data

US 2013/0042706 A1 Feb. 21, 2013

Related U.S. Application Data

(60) Provisional application No. 61/525,782, filed on Aug. 21, 2011.

(51) Int. Cl.
*G01R 31/12* (2006.01)
*G01R 1/067* (2006.01)

(52) U.S. Cl.
CPC ........ *G01R 31/1245* (2013.01); *G01R 1/06777* (2013.01); *Y10S 901/44* (2013.01)
USPC .......... 73/865.9; 73/865.8; 324/551; 324/552; 901/44

(58) Field of Classification Search
CPC ........................ G01R 1/06777; G01R 31/1245
USPC .............. 73/865.8–865.9; 324/551–552, 554; 901/44, 46
See application file for complete search history.

(56) References Cited

U.S. PATENT DOCUMENTS

| | | | | |
|---|---|---|---|---|
| 4,411,608 A | * | 10/1983 | Yanagisawa | 425/123 |
| 7,486,084 B2 | | 2/2009 | Phillips et al. | |
| 8,505,461 B2 | * | 8/2013 | Phillips et al. | 104/87 |
| 8,666,553 B2 | * | 3/2014 | Phillips et al. | 901/1 X |
| 8,844,387 B1 | * | 9/2014 | Tunacik et al. | 73/865.8 |
| 2010/0100239 A1 | | 4/2010 | Park et al. | |
| 2011/0101989 A1 | | 5/2011 | Hyde et al. | |

FOREIGN PATENT DOCUMENTS

| | | | | |
|---|---|---|---|---|
| GB | 2079957 A | * | 1/1982 | ............. G01R 1/067 |
| SU | 724338 | | 3/1980 | |
| SU | 1305031 | | 4/1987 | |

OTHER PUBLICATIONS

WIPO, International Search Report, Nov. 21, 2012, Russia, for PCT/US2012/051695.

* cited by examiner

*Primary Examiner* — Thomas P Noland
(74) *Attorney, Agent, or Firm* — Trego, Hines & Ladenheim, PLLC

(57) ABSTRACT

An inspection apparatus for inspecting high voltage insulators is disclosed. The inspection apparatus includes a first platform having first and second linkages, at least one outer gripping mechanism having first and second arms extending outwardly from the first platform, a second slidable platform adapted to slide along the first and second linkages, and at least one inner gripping mechanism having third and fourth arms extending outwardly from the second slidable platform. The outer and inner gripping mechanisms are adapted to move between an open position where the insulator is received by the outer and inner gripping mechanisms and a closed position where the outer and inner gripping mechanisms engage the insulator.

16 Claims, 9 Drawing Sheets

APPARATUS AND METHOD FOR INSPECTING HIGH VOLTAGE INSULATORS

BACKGROUND OF THE INVENTION

This application claims the benefit of Provisional Application No. 61/525,782 filed on Aug. 21, 2011.

This application relates to an apparatus and method for inspecting high voltage insulators and, more particularly, to a self contained inspection robot for inspecting high voltage insulators.

Inspecting, evaluating, and maintaining transmission and distribution insulators is challenging due to the associated high voltages and large inspection distances. This is particularly challenging for non-ceramic insulators (NCI) which requires a user to confirm the short-term electrical and mechanical integrity of both the installed and the replacement units.

One of the primary inspection methods used today is visual/camera inspection. This is often challenging due to poor lighting, challenging angles of inspection, and long inspection distances. Other inspection methods require contact to be made with the insulator. This is often done by securing an inspection tool to the end of a hotstick which is manipulated by a human operator from a bucket truck. Utilizing an inspection tool from a hotstick creates a situation (1) that is challenging due to the high cantilever loads the operator has to manage, (2) that introduces uncertainty due to operator error in positioning the unit, and (3) that requires the operator to be close to the energized conductors which creates a potentially hazardous environment (live work).

BRIEF SUMMARY OF THE INVENTION

These and other shortcomings of the prior art are addressed by the present invention, which provides an apparatus and method for inspecting high voltage insulators that provide proper inspection of an insulator without creating a hazardous environment.

According to an aspect of the invention, an inspection apparatus for inspecting high voltage insulators includes a first platform having first and second linkages, at least one outer gripping mechanism having first and second arms extending outwardly from the first platform, a second slidable platform adapted to slide along the first and second linkages, and at least one inner gripping mechanism having third and fourth arms extending outwardly from the second slidable platform. The outer and inner gripping mechanisms are adapted to move between an open position where the insulator is received by the outer and inner gripping mechanisms and a closed position where the outer and inner gripping mechanisms engage the insulator.

According to another aspect of the invention, an inspection apparatus for inspecting high voltage insulators spaced-apart first and second outer gripping mechanisms extending outwardly from a first platform and interconnected by at least one linkage such that the first and second outer gripping mechanisms move from an open position for receiving an insulator to a closed position for engaging the insulator simultaneously, and spaced-apart first and second inner gripping mechanisms positioned between the first and second outer gripping mechanisms. The first and second inner gripping mechanisms extend outwardly from a moveable second platform and are interconnected by a gear drive such that the first and second inner gripping mechanisms move from an open position for receiving the insulator to a closed position for engaging the insulator simultaneously. The second platform is slidably connected to the at least one linkage to allow the first and second inner gripping mechanisms to move along the linkage between the first and second outer gripping mechanisms and allow the inspection apparatus to traverse an insulator.

According to another aspect of the invention, a method for inspecting high voltage insulators includes the steps of providing an inspection apparatus having at least one outer gripping mechanism extending outwardly from a first platform, at least one inner gripping mechanism extending outwardly from a second platform, and at least one sensor contained in the outer gripping mechanism. The second platform is slidable along a linkage of the first platform. The method further includes the steps of placing the inspection apparatus on the insulator to be inspected, moving the at least one outer gripping mechanism and at least one inner gripping mechanism to a closed position to secure the inspection apparatus to the insulator, and using the at least one sensor to determine conductive and high permittivity defects in the insulator.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
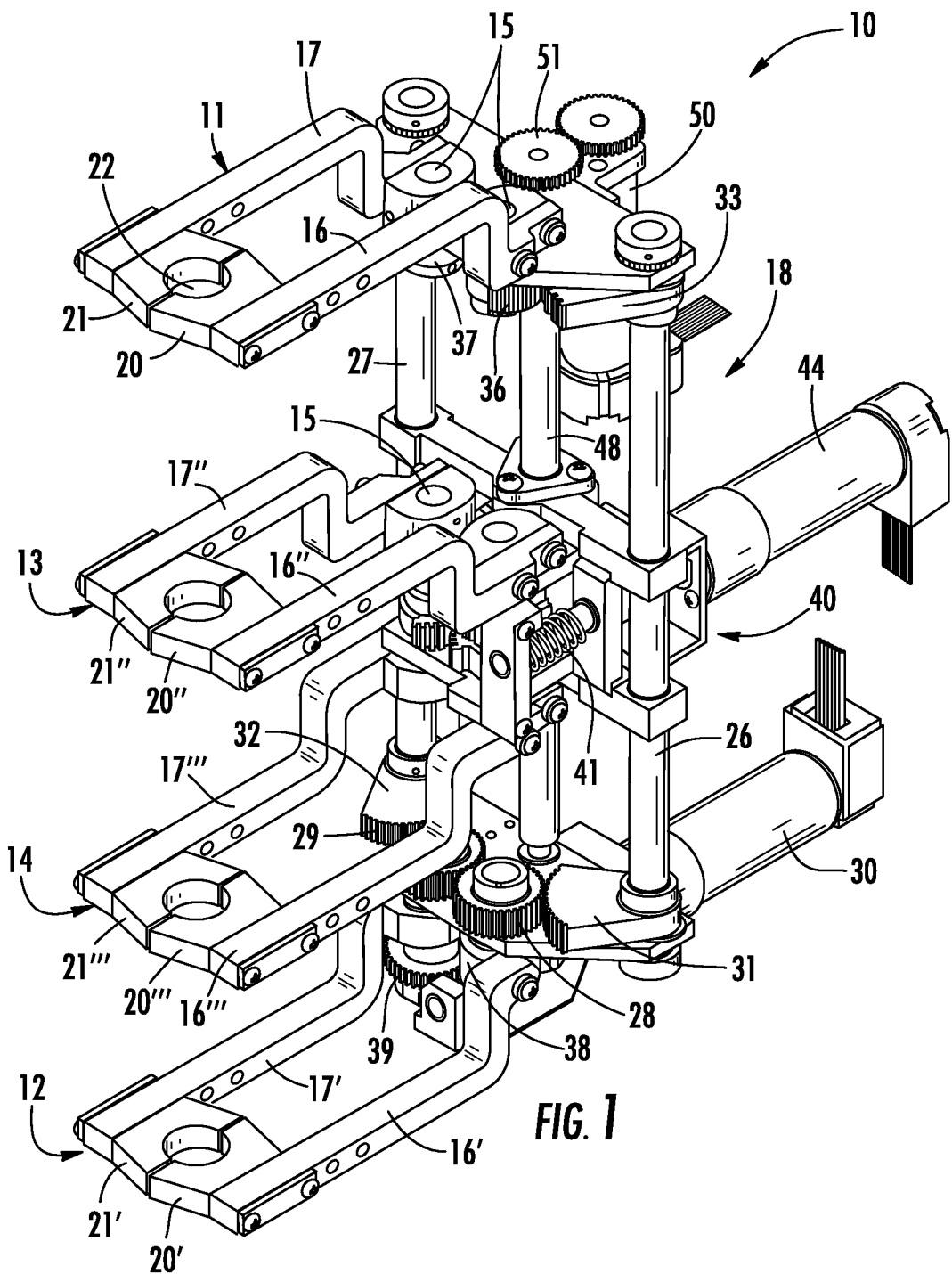
FIG. 1 is a perspective view of an apparatus according to an embodiment of the invention.
Figure 2:
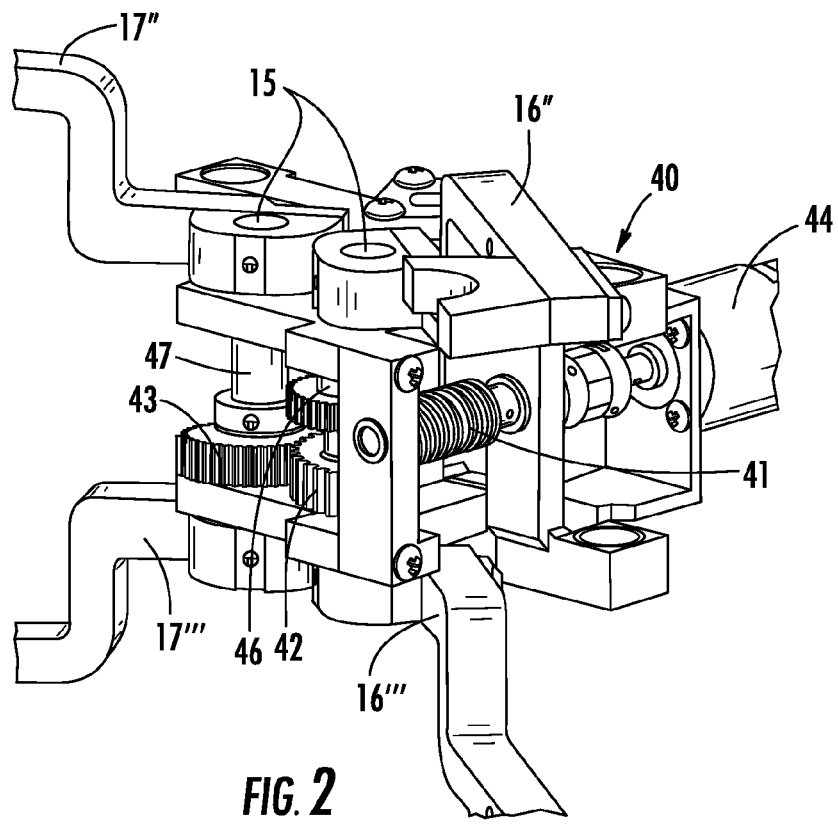
FIG. 2 shows drive assembly of inner gripping mechanisms of the apparatus of FIG. 1.
Figure 3:
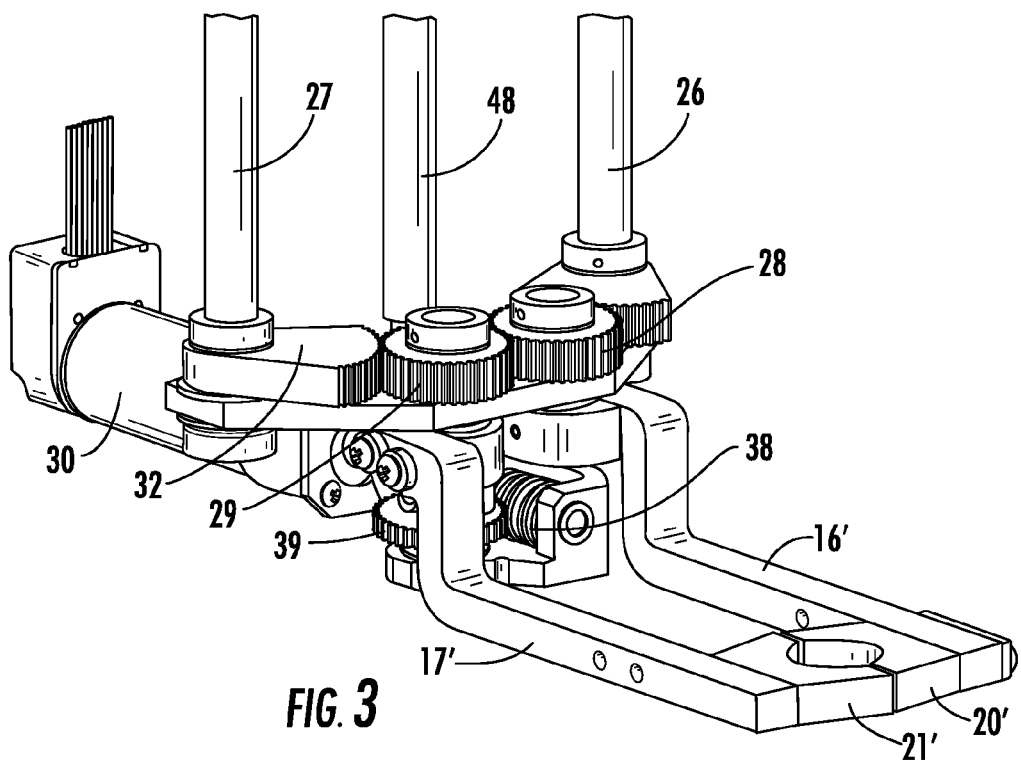
FIG. 3 shows drive assembly of outer gripping mechanism of the apparatus of FIG. 1.
Figure 4:
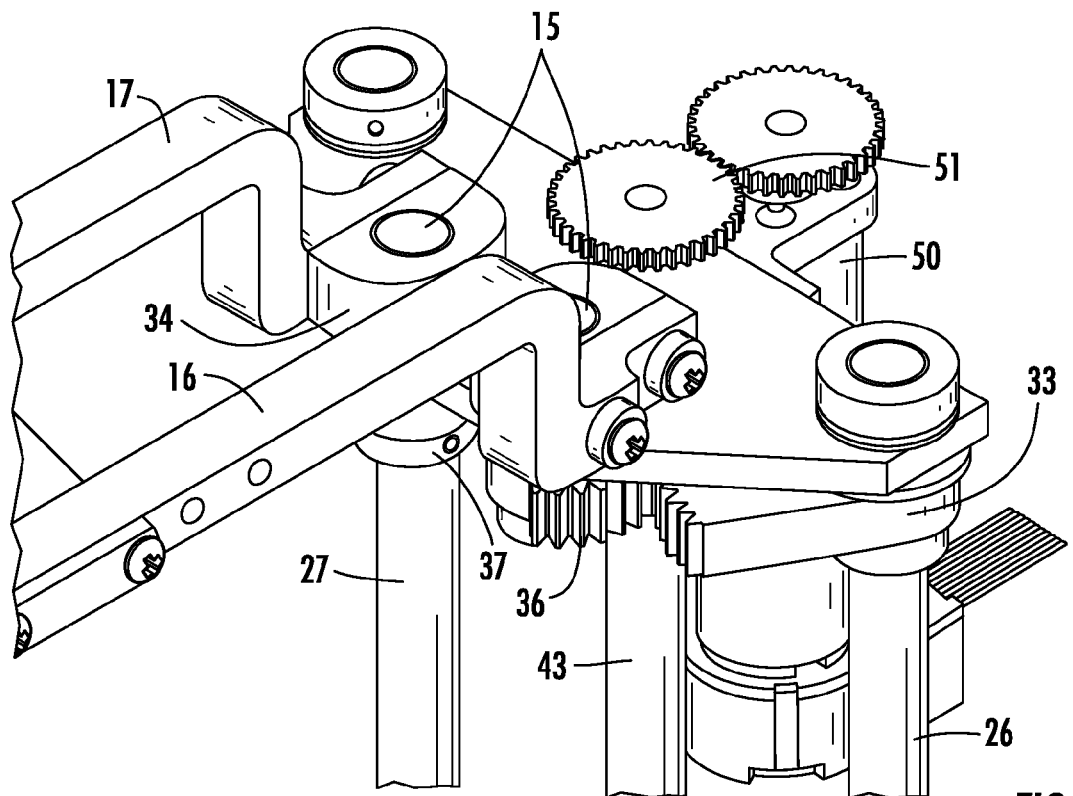
FIG. 4 shows drive assembly of screw gear of the apparatus of FIG. 1.
Figure 5:
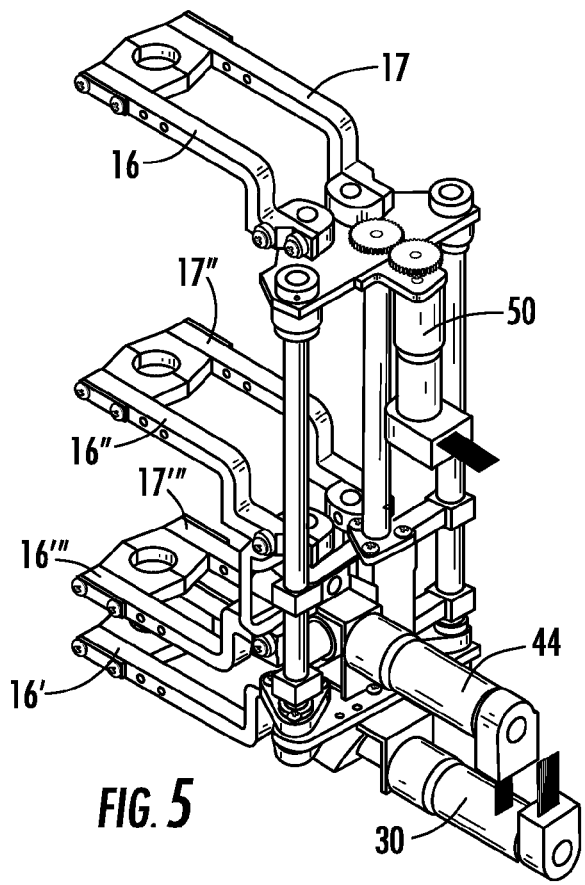
FIG. 5 shows a rear perspective of the apparatus of FIG. 1.
Figure 6:
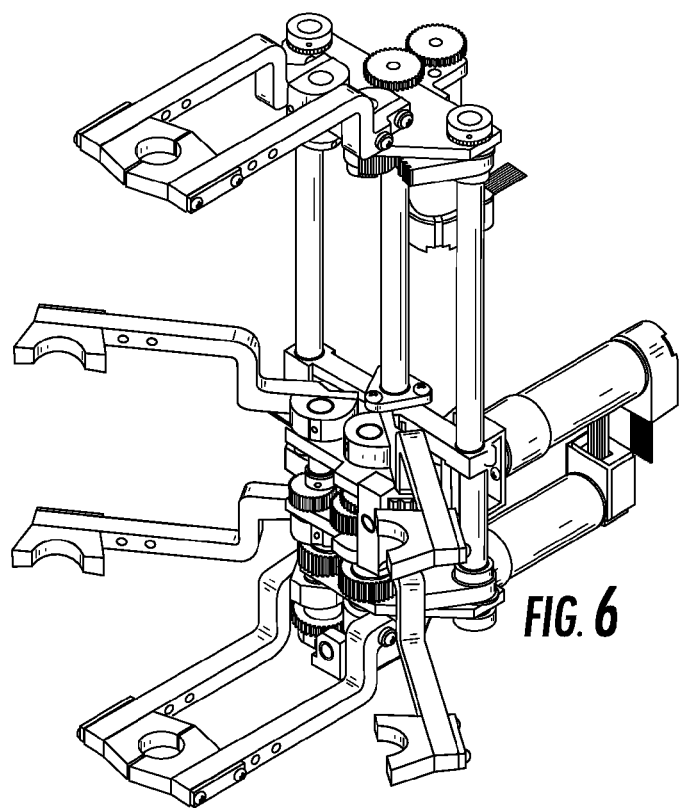
FIG. 6 shows the apparatus of FIG. 1 with inner mechanisms open and in a lower position.
Figure 7:
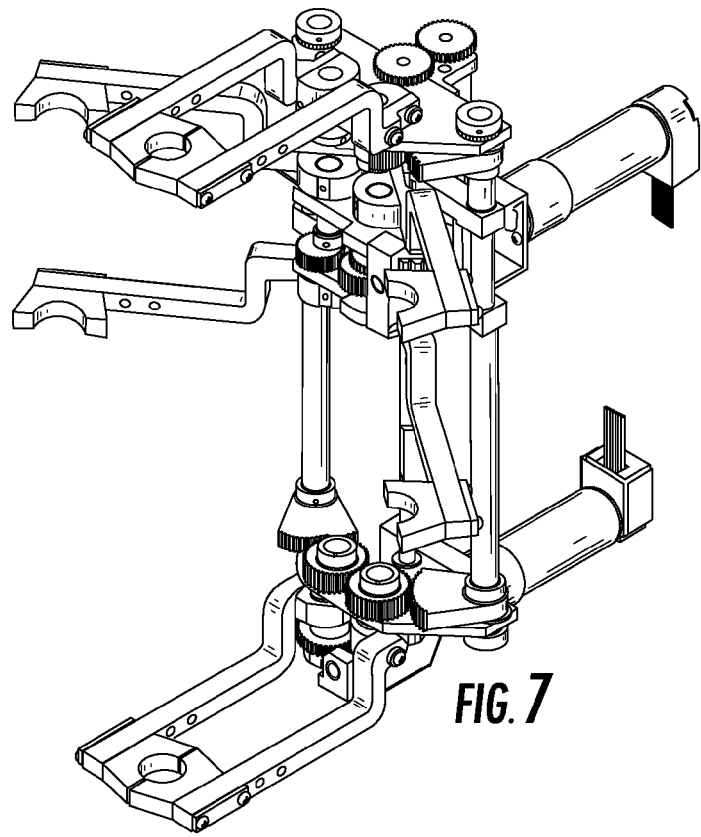
FIG. 7 shows the apparatus of FIG. 1 with the inner mechanisms open and in an upper position.
Figure 8:
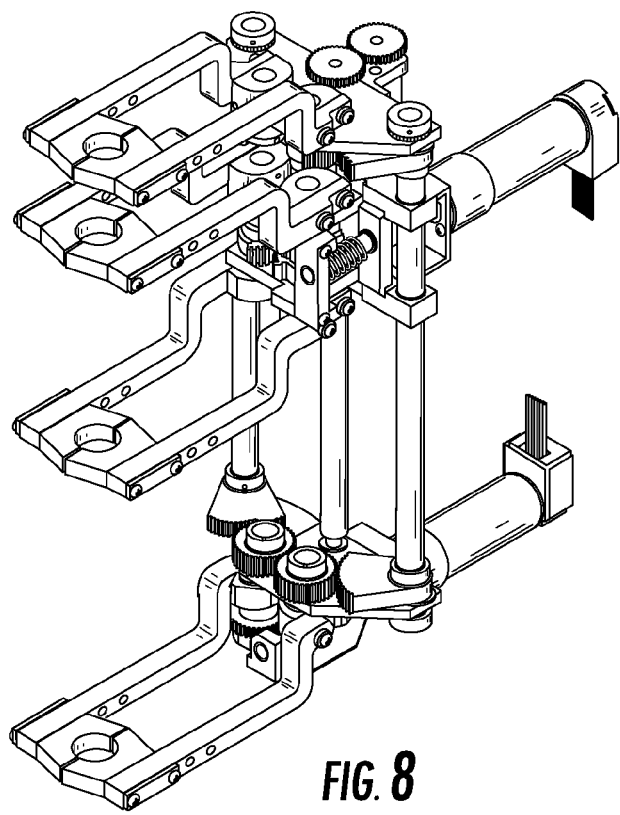
FIG. 8 shows all of the gripping mechanisms of the apparatus of FIG. 1 in a closed position.

Referring to the drawings, an exemplary inspection apparatus in the form of a robot according to an embodiment of the invention is illustrated in FIGS. 1-5 and shown generally at reference numeral 10.

In general, the robot 10 is self contained and is clipped on an insulator. An operator is then able to move away from a hazardous environment and control the robot 10 using a wireless link. The robot 10 may include inspection technologies such as a close up camera, permittivity/conductivity sensors, and any other desired inspection technology (infra-red, NCI tools, ultrasonic, etc). This enables (1) the operator to have reduced exposure to hazardous environments; (2) the inspection distance, especially for optical devices to be small; and (3) inspection tools that require contact to be applied in a more consistent manner.

The robot 10 includes outer 11, 12 and inner 13, 14 gripping mechanisms for gripping onto an insulator. For simplicity, only gripping mechanism 11 will be discussed; however, it should be appreciated that gripping mechanisms 12, 13, and 14 have the same basic structure and that the discussion relating to mechanism 11 also applies to mechanisms 12, 13, and 14. Further, it should be appreciated that like numbers or prime numbers are intended to identify similar structures.

The gripping mechanism 11 includes a pair of arms 16 and 17 extending outwardly from a main platform 18 of the robot 10. When in a closed position, the arms 16 and 17 are substantially parallel to each other. Each arm 16 and 17 includes a gripping device 20, 21 attached thereto for securing the robot to an insulator. The gripping devices 20, 21 have a concave section 22 that may be U-shaped, V-shaped or any other complementary shape to allow the devices 20, 21 to "mate" with a cylindrical sheath section of an insulator. The arms 16 and 17 may be made out of fiberglass and the gripping devices 20 and 21 may be made of a non-conductive plastic. However, it should be appreciated that other suitable materials may be used to reduce corona issues, reduce the impact of the local electric field, and reduce the portion of the insulator that is electrically compromised by the presence of the robot 10. It should also be appreciated that various sensing technologies such as visual and infra-red inspection devices, voltage and current sensors, ultrasonic inspection devices, etc. may be embedded into the concave section 22 of the gripping devices 20 and 21.

Each of the arms 16 and 17 are individually hinged to the platform 18 by pivots 15 to allow the arms 16 and 17 to pivot from a closed position, FIG. 1, where the robot 10 is secured to an insulator, to an open position, FIGS. 6-10, to allow the robot 10 to be positioned onto an insulator.

Referring, particularly, now to outer gripping mechanisms 11 and 12, the outer gripping mechanisms 11 and 12 are mechanically joined together using linkages 26 and 27. The linkages 26 and 27 ensure that the gripping mechanisms 11 and 12 open and close simultaneously. As shown, linkage 26 interconnects arms 16 and 16' and linkage 27 interconnects arms 17 and 17'. The linkages 26 and 27 are driven by gears 28 and 29 which are driven by an electric motor 30. The gears 28 and 29 interact with gears 31 and 32, respectively, to rotate the linkages 26 and 27. As the linkages 26 and 27 are rotated, gears 33 and 34 interact with gears 36 and 37 to move arms 16 and 17. At the same time, arms 16' and 17' are moved by gears 38 and 39, which are directly connected to gears 28 and 29 to enact simultaneous movement.

Referring, particularly, now to inner gripping mechanisms 13 and 14, the inner gripping mechanisms 13 and 14 are connected to a slidable platform 40 that is adapted to slide along linkages 26 and 27. Like gripping mechanisms 11 and 12, gripping mechanisms 13 and 14 are adapted to move simultaneously with each other. The arms 16", 16''' and 17", 17''' move from an closed position, FIG. 1, to an open position, FIGS. 6-10, by a worm drive 41 which interacts with gears 42 and 43. The worm drive 41 is driven by electric motor 44. Gear 42 drives both arms 17" and 17''' using linkage 46 and gear 43 drives both arms 16" and 16''' using linkage 47 to ensure simultaneous movement of the arms.

As discussed, the platform 40 is adapted to slide along linkages 26 and 27. The platform 40 is driven by a screw gear 48 connected to the platform 40. The screw gear 48 is driven by electric motor 50 which interacts with gear 51 to drive the screw gear 48. As the screw gear 48 is rotated by the motor 50, the platform moves either up or down along the linkages 26 and 27 depending the direction of the motor.

Figure 9:
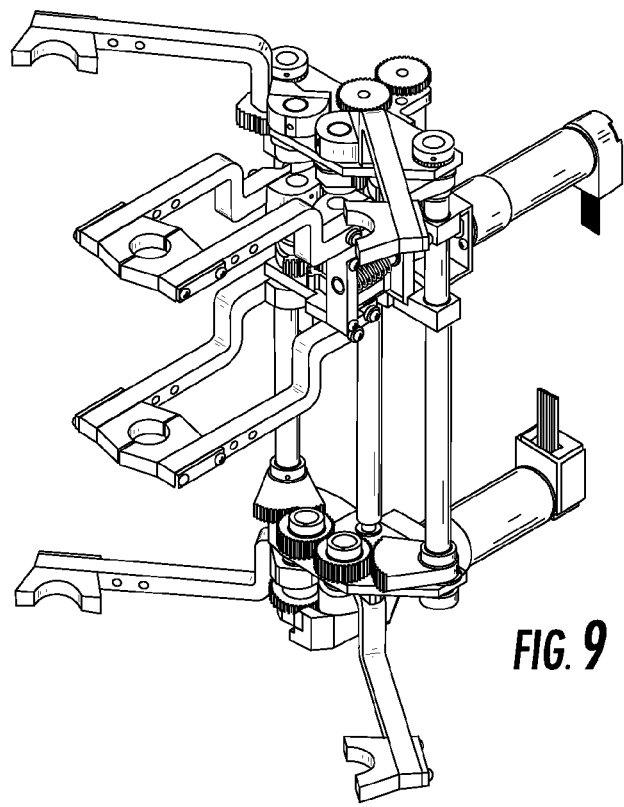
FIG. 9 shows the apparatus of FIG. 1 with outer mechanisms open and the inner mechanisms in an upper position.
Figure 10:
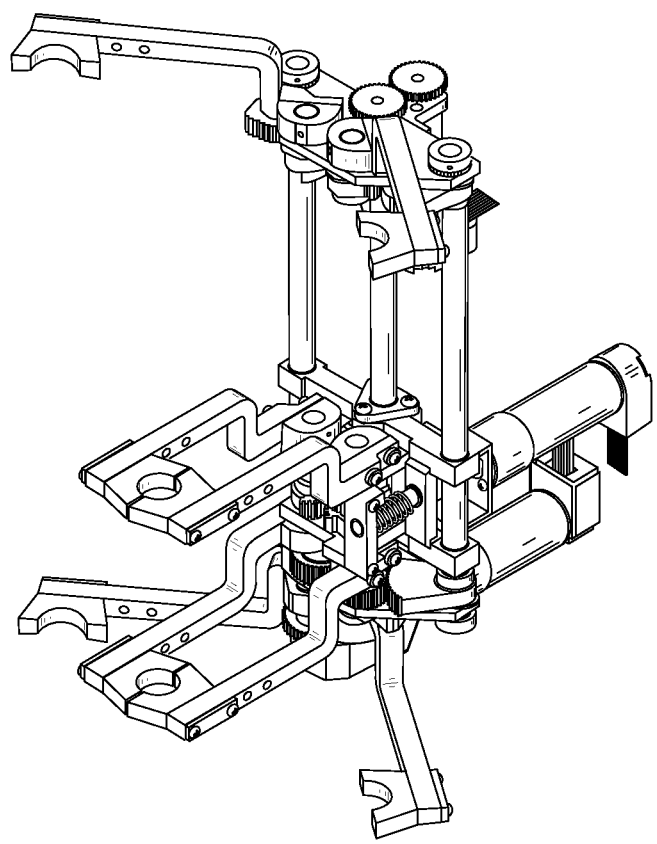
FIG. 10 shows the apparatus of FIG. 1 with the outer mechanisms open and the inner mechanisms in a lower position.

Referring to FIGS. 6-10, outer 11, 12 and inner 13, 14 gripping mechanisms are adapted to move relative to each other. For example, the inner 13, 14 mechanisms may be in an open position while the outer 11, 12 mechanisms are in a closed position, FIG. 6. Also, the inner 13, 14 mechanisms may move from a lower position, FIG. 6, to a higher position, FIG. 7. As shown in FIGS. 9 and 10, the outer 11, 12 mechanisms may be in an open position while the inner 13, 14 mechanisms are in a closed position. When the two of the individual arms are in the closed position they clamp around the sheath of the insulator mechanically attaching the robot to insulator.

The robot moves up and down the insulator in the following manner:

(1) The robot is placed on the insulator and the outer mechanisms 11, 12 simultaneously are closed so that they grip on to the sheath of the insulator. The weight is held by these two mechanisms.

(2) The inner gripping mechanisms 13, 14 are open and are close to the lower side of the robot 10. The inner gripping mechanisms 13, 14 are then moved along the linkages 26 and 27 by the screw gear 48 and motor 50 until they get to the upper side of the robot 10 (or some distance between the lower and upper side.

(3) The inner gripping mechanisms 13, 14 then simultaneously close. The weight of the robot 10 is then held by both the inner 13, 14 and outer 11, 12 gripping mechanisms.

(4) The outer gripping mechanisms 11, 12 then simultaneously open. The weight of the robot 10 is now held by the inner gripping mechanisms 13, 14.

(5) The inner gripping mechanisms 13, 14 are then moved along the linkages 26 and 27 by screw gear 48 and motor 50 until they reach the lower side of the robot, thereby, moving the entire robot 10 along the insulator.

(6) The outer gripping mechanisms 11, 12 then close and the process repeats as the robot 10 moves up and down the insulator.

The robot 10 enables inspection of vertical and horizontal insulators and of insulators positioned at any angle therebetween.

Micro-switches (not shown) tell the robot 10 when the gripping mechanisms 11-14 are fully open and closed. The robot 10 also knows that the arms are fully closed by measuring the torque (current and voltage) that the electric motor is consuming. The movement up and down the insulator can be automated and controlled by electronics by: (1) knowing the exact shed and sheath spacing and (2) optical (LED and photodiodes) and imaging sensors (cameras with image processing) that identify the presence of sheds and sheath sections. And know when to open and close.

The robot 10 has an onboard rechargeable battery. Control of the robot 10 and the collection of inspection data is performed or communicated by an RF link. The control can be completely manual—when an operator controls the robot arms, etc.; completely automatic; or a combination thereof—e.g. the operator tells the robot to move 15 inches and make measurements and it executes. Optical cameras may be mounted on the arms or the main platform 18.

Figure 11:
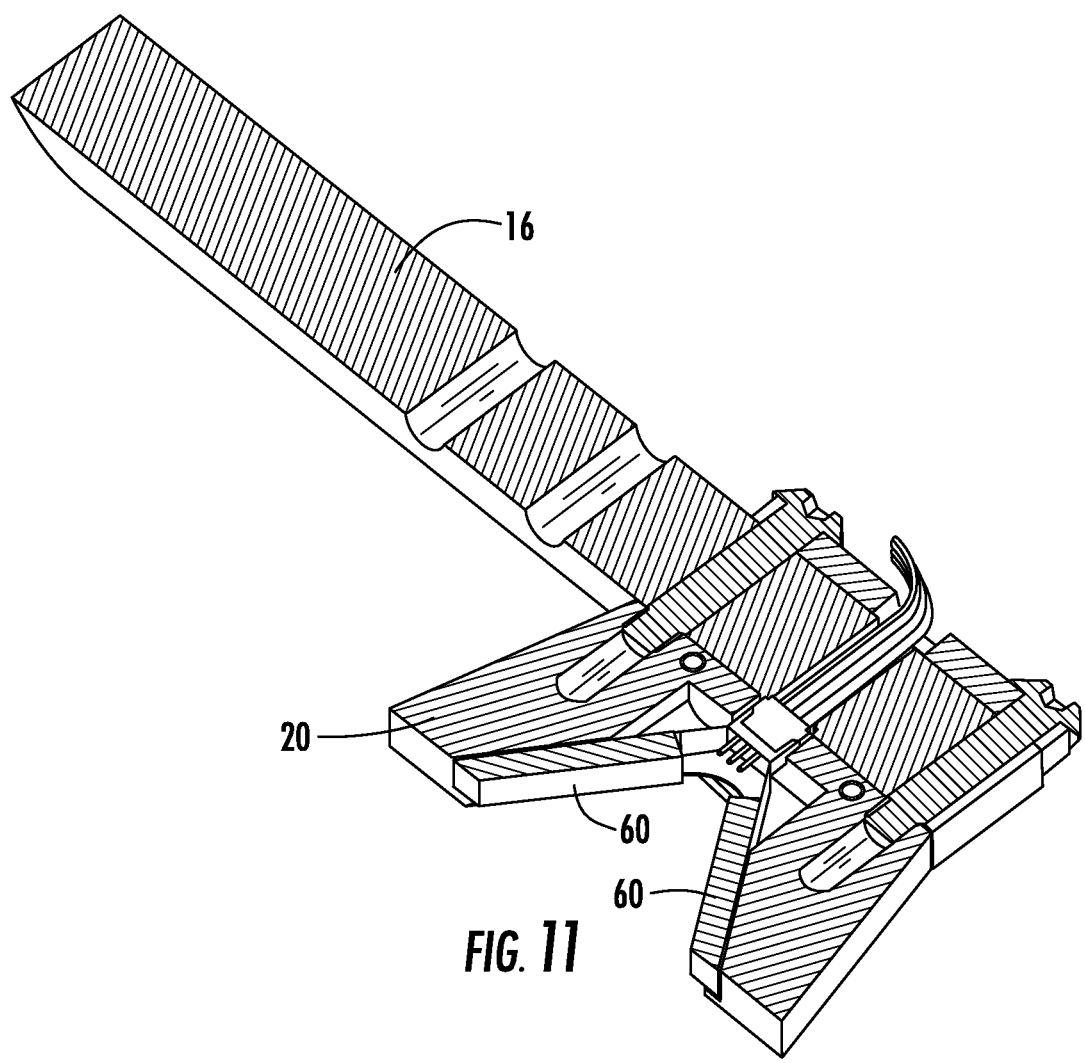
FIG. 11 shows an arm of the apparatus of FIG. 1 with a sensor embedded in a grip of the arm.
Figure 12:
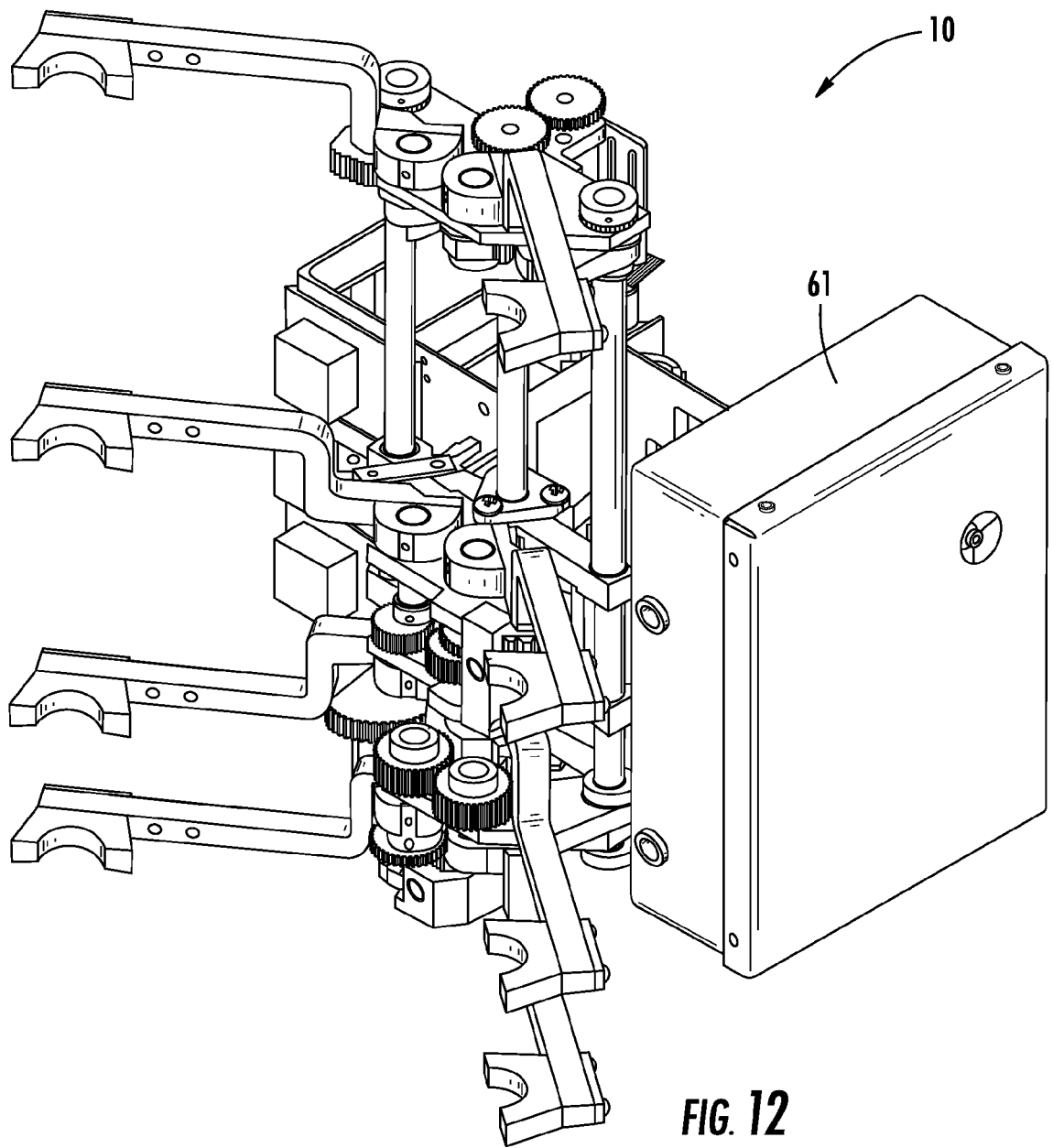
FIG. 12 shows the apparatus of FIG. 1 with electronics carried thereupon.

Referring to FIGS. 11-12, the robot 10 may also be outfitted with sensors 60. The sensors 60 are contained in the gripping devices 20, 21 of each gripping mechanism 11-14. The sensors 60 are used to determine conductive or high permittivity defects in an insulator, such as composite/polymer insulators. The sensor and camera electronics 61 are added to the robot 10 as a payload. This approach can adapt to any insulator shed/sheath spacing and diameter and can work on various types of insulators, including composite type insulators.

Figure 13:
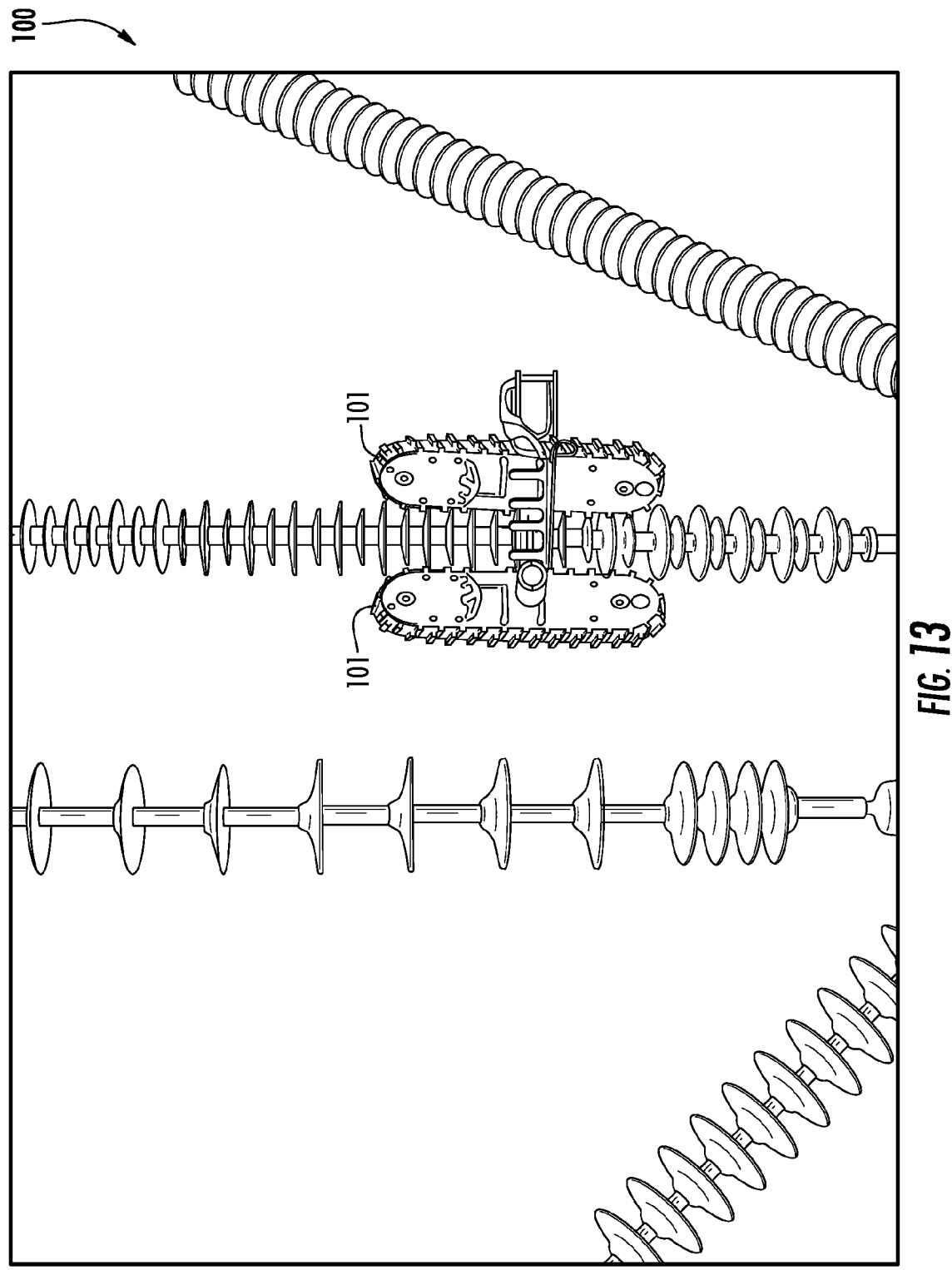
FIG. 13 shows an alternate embodiment of the apparatus of FIG. 1 using tracks to move the apparatus along an insulator.

Referring to FIG. 13, in another embodiment, a robot 100 may include tracks 101 for driving the robot 100 along an insulator.

The foregoing has described an apparatus and method for inspecting high voltage insulators. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. An inspection apparatus for inspecting high voltage insulators, comprising:
   (a) a first platform having first and second linkages;
   (b) at least one outer gripping mechanism having first and second arms extending outwardly from the first platform;
   (c) a second slidable platform adapted to slide along the first and second linkages; and
   (d) at least one inner gripping mechanism having third and fourth arms extending outwardly from the second slidable platform, wherein the outer and inner gripping mechanisms are adapted to move between an open position where the insulator is received by the outer and inner gripping mechanisms and a closed position where the outer and inner gripping mechanisms engage the insulator.

2. The inspection apparatus according to claim 1, wherein the first and second arms are pivotally connected to the first platform to allow the arms to pivot between the open and closed positions.

3. The inspection apparatus according to claim 1, wherein when in the closed position, the first and second arms are substantially parallel.

4. The inspection apparatus according to claim 1, wherein the first and second arms each include:
   (a) a gripping device adapted to secure the inspection apparatus to the insulator; and
   (b) sensors contained in the gripping device to determine conductive or high permittivity defects in the insulator.

5. The inspection apparatus according to claim 1, wherein the third and fourth arms are pivotally connected to the second slidable platform to allow the arms to pivot between the open and closed positions.

6. The inspection apparatus according to claim 1, wherein when in the closed position, the third and fourth arms are substantially parallel.

7. The inspection apparatus according to claim 1, wherein the third and fourth arms each include:
   (a) a gripping device adapted to secure the inspection apparatus to the insulator; and
   (b) sensors contained in the gripping device to determine conductive and high permittivity defects in the insulator.

8. An inspection apparatus for inspecting high voltage insulators, comprising:
   (a) spaced-apart first and second outer gripping mechanisms extending outwardly from a first platform and interconnected by at least one linkage such that the first and second outer gripping mechanisms move from an open position for receiving an insulator to a closed position for engaging the insulator simultaneously;
   (b) spaced-apart first and second inner gripping mechanisms positioned between the first and second outer gripping mechanisms, the first and second inner gripping mechanisms extend outwardly from a moveable second platform and are interconnected by a gear drive such that the first and second inner gripping mechanisms move from an open position for receiving the insulator to a closed position for engaging the insulator simultaneously;
   (c) wherein the second platform is slidably connected to the at least one linkage to allow the first and second inner gripping mechanisms to move along the linkage between the first and second outer gripping mechanisms and allow the inspection apparatus to traverse an insulator.

9. The inspection apparatus according to claim 8, wherein each of the first and second outer gripping mechanisms include:
   (a) first and second arms pivotally attached to the first platform for movement between an open position where an insulator is received between the first and second arms and a closed position where the insulator is secured between the first and second arms; and
   (b) a first gripping device secured to the first arm and a second gripping device secured to the second arm, wherein the first and second gripping devices are positioned for mating engagement around the insulator.

10. The inspection apparatus according to claim 9, further including sensors contained in at least one of the first and second gripping devices to determine conductive and high permittivity defects in the insulator.

11. The inspection apparatus according to claim 9, wherein an inner surface of the first and second gripping devices are concave to allow the first and second gripping devices to mate with a cylindrical section of the insulator.

12. The inspection apparatus according to claim 8, wherein each of the first and second inner gripping devices include:
   (a) first and second arms pivotally attached to the second platform for movement between an open position where an insulator is received between the first and second arms and a closed position where the insulator is secured between the first and second arms; and
   (b) a first gripping device secured to the first arm and a second gripping device secured to the second arm, wherein the first and second gripping devices are positioned for mating engagement around the insulator.

13. The inspection apparatus according to claim 12, further including sensors contained in at least on of the first and second gripping devices to determine conductive and high permittivity defects in the insulator.

14. The inspection apparatus according to claim 12, wherein an inner surface of the first and second gripping devices are concave to allow the first and second gripping devices to mate with a cylindrical section of the insulator.

15. The inspection apparatus according to claim 8, further including a motor operably connected to the at least one linkage and adapted to drive the at least one linkage such that driving the linkage causes the first and second outer gripping mechanisms to move between the open and closed positions.

16. The inspection apparatus according to claim 8, further including:
   (a) a worm drive operably connected to the first and second inner gripping mechanisms; and
   (b) a motor operably connected to the worm drive, wherein the motor causes the worm drive to move the first and second inner gripping mechanisms between the open and closed positions.

* * * * *